(12) United States Patent
Shiau

(10) Patent No.: US 6,221,698 B1
(45) Date of Patent: Apr. 24, 2001

(54) PROCESS FOR MAKING HIGH DENSITY MASK ROM

(75) Inventor: Jiann-Ming Shiau, Hsinchu (TW)

(73) Assignee: Winbond Electronics Corporation, Hsinchu (TW)

( * ) Notice: Subject to any disclaimer, the term of this patent is extended or adjusted under 35 U.S.C. 154(b) by 0 days.

(21) Appl. No.: 09/335,749

(22) Filed: Jun. 18, 1999

(51) Int. Cl.[7] ................................................. H01L 21/82
(52) U.S. Cl. ........................ 438/128; 438/275; 438/297
(58) Field of Search .................................. 438/275, 981, 438/297, 128, 129

(56) References Cited

U.S. PATENT DOCUMENTS

| | | | |
|---|---|---|---|
| 4,750,024 | * | 6/1988 | Schreck ................................. 357/54 |
| 5,480,823 | * | 1/1996 | Hsu ...................................... 438/275 |
| 5,504,030 | * | 4/1996 | Chung et al. ........................ 438/981 |
| 5,585,296 | * | 12/1996 | Chung et al. ........................ 438/275 |

\* cited by examiner

*Primary Examiner*—David Nelms
*Assistant Examiner*—Dung A Le
(74) *Attorney, Agent, or Firm*—Finnegan, Henderson, Farabow, Garrett & Dunner, L.L.P.

(57) ABSTRACT

A method of fabricating high density mask-type read only memory (ROM) devices that utilize a thick gate oxide to form non-programable cells and that can be easily integrated into standard CMOS manufacturing. The method includes forming a thick oxide over a semiconductor substrate, removing portions of the thick oxide layer, ion implanting dopants to form buried bit lines, patterning to form coding openings, forming a gate oxide within the coding openings, and forming a plurality of polysilicon gate electrodes constituting word lines of the mask ROM.

14 Claims, 4 Drawing Sheets

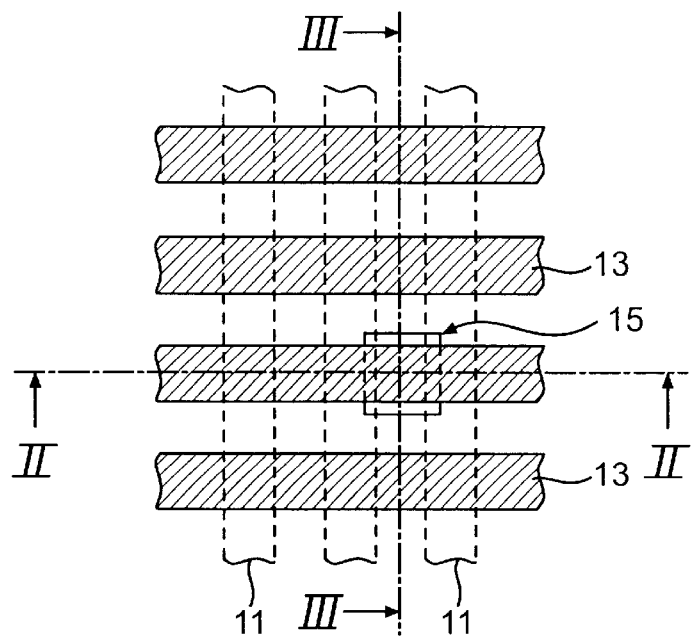
FIG. 1
PRIOR ART
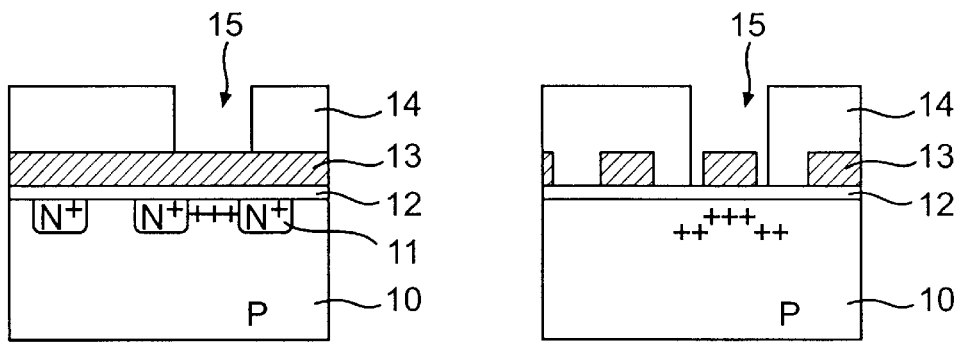
FIG. 2
PRIOR ART
FIG. 3
PRIOR ART

PROCESS FOR MAKING HIGH DENSITY MASK ROM

FIELD OF THE INVENTION

The present invention relates generally to a method for making a semiconductor memory device and, more particularly, to a method of making a high density mask-type read only memory.

BACKGROUND OF THE INVENTION

Read only memory (ROM) devices are semiconductor integrated circuits widely used in microprocessor-based systems to permanently store information even when power is off. ROM devices are particularly well suited for applications where a large volume of devices having identical data are required or for storing data that is repeatedly used. An example of such an application is the BIOS on personal computers. ROM devices store binary signals as an array of active elements that are typically programmed as part of the fabrication process by the integrated circuit manufacturer according to a customer's specifications.

Conventional mask ROM devices include NOR-type and NAND-type. A NOR-type ROM is formed by connecting in parallel the sources and the drains of the memory transistors. Alternatively, connecting the sources and the drains of the memory transistors in series forms a NAND-type ROM.

As shown in FIGS. 1–3 fabrication of a conventional flat-cell mask ROM begins with a semiconductor silicon substrate (10) doped with P-type impurities. Buried bit lines (11) that will constitute source/drain regions are formed by implanting N-type impurities into multiple parallel strip shaped regions of the substrate. A gate oxide layer (12), typically silicon oxide formed by thermal oxidation, is then formed over the substrate (10). Gate electrodes (13) are then formed orthogonal to the buried bit lines (11), constituting word lines for the memory array of the mask ROM device. Convention coding procedure requires that a photoresist layer (14) be applied covering the surface of the substrate (10) while leaving the coding openings (15) exposed. Impurity ions are then implanted into the exposed channel regions of the selected memory cells.

The channel regions for the memory cell transistors lies in the region of the substrate between every two adjacent bit lines beneath the word lines. The memory cell transistors are coded as either blocking or conducting. A 1 or 0 data bit can be defined as either state. If a cell is implanted with P-type impurities, the cell is set to have a high threshold voltage effectively setting the memory cell to a permanently OFF state representing, for example, the storage of binary digit of 0. Cells without implanted impurities have a low threshold voltage setting the memory cell to a permanently ON state representing, for example, the storage of a binary 1.

As a result of semiconductor device manufacturers striving to improve performance and reduce cost, the size of ROM devices continues to shrink while the density of ROM devices continues to increase. A problem arises because the reduced space between adjacent bit lines makes leakage current arising from the P-type implants and word line parasitic capacitance relatively more detrimental.

U.S. Pat. No. 5,504,036 to Chung et al. discloses one solution to these problems. By using a liquid-phase deposition process to form a thick code oxide, Chung et al. produce permanently OFF cells on the semiconductor substrate. A liquid-phase deposition process, however, cannot easily be integrated into CMOS manufacturing.

U.S. Pat. No. 5,480,823 to Hsu discloses the use of a thick oxide to produce normally OFF cells. Hsu teaches the growth of a thick oxide layer on areas of a substrate that have been defined by photolithography and subsequent etch of a silicon nitride layer. Growth of the thick oxide in this manner, however, produces a "birds beak" on the buried bit line edge.

In light of the foregoing, there is a need for a process to manufacture ROM with a thick code oxide that can be easily integrated into standard CMOS manufacturing.

SUMMARY OF THE INVENTION

Accordingly, the present invention is directed to method for manufacturing a mask programmable ROM including the steps of forming an oxide layer with a thickness greater than about 1000Å on a semiconductor substrate, forming a first mask layer over the oxide layer and patterning the first mask layer to form bit lines, removing regions of the oxide layer within the bit lines to expose the semiconductor substrate, ion implanting conductivity imparting dopants into the exposed substrate to form buried bit line regions, removing the first mask layer and forming a second mask layer, printing a code pattern and forming coding openings that expose portions of the substrate between the bit lines, removing the second mask layer, growing a gate oxide within the coding openings, depositing a conducting layer on remaining regions of the oxide layer, the buried bit line regions, and the gate oxide, and forming a plurality of conducting gate structures constituting word lines for the mask ROM.

In another aspect of the present invention, there is provided a method for manufacturing a mask programmable ROM integrated into a CMOS fabrication process including the steps of growing an oxide layer with a thickness greater than about 1000Å on a P-type semiconductor substrate, depositing a first mask layer on the oxide layer and forming a bit line pattern, removing regions of the first mask layer to form bit lines, removing regions of the oxide layer within the bit line area to expose the semiconductor substrate, ion implanting conductivity imparting dopants into the exposed substrate to form buried bit line regions, removing the first mask layer, forming a second mask layer and patterning the second mask layer to form coding openings exposing areas of the semiconductor substrate, removing the second mask layer, forming a gate oxide within the coding openings, depositing a polysilicon layer, forming a plurality of polysilicon gate electrodes oriented orthogonally to the bit lines constituting word lines for said mask ROM.

It is to be understood that both the foregoing general description and the following detailed description are exemplary and explanatory and are intended to provide further explanation of the invention as claimed.

The accompanying drawings are included to provide a further understanding of the invention and are incorporated in and constitute a part of this specification, illustrate several embodiments of the invention and together with the description serve to explain the principles of the invention.

BRIEF DESCRIPTION OF THE DRAWINGS

The accompanying drawings, which are incorporated in and constitute a part of this specification, illustrate an embodiment of the invention and, together with the description, serve to explain the objects, advantages, and principles of the invention.

FIG. 1 is a top view of a prior art ROM device.

FIG. 2 is a cross-sectional view of a prior art ROM device taken along line II—II of FIG. 1.

FIG. 3 illustrates another cross-sectional view of a prior art ROM device taken along line III—III of FIG. 1.

DETAILED DESCRIPTION OF THE PREFERRED EMBODIMENTS

Reference will now be made in detail to the preferred embodiments of the invention, examples of which are illustrated in the accompanying drawings.

Figure 4A:
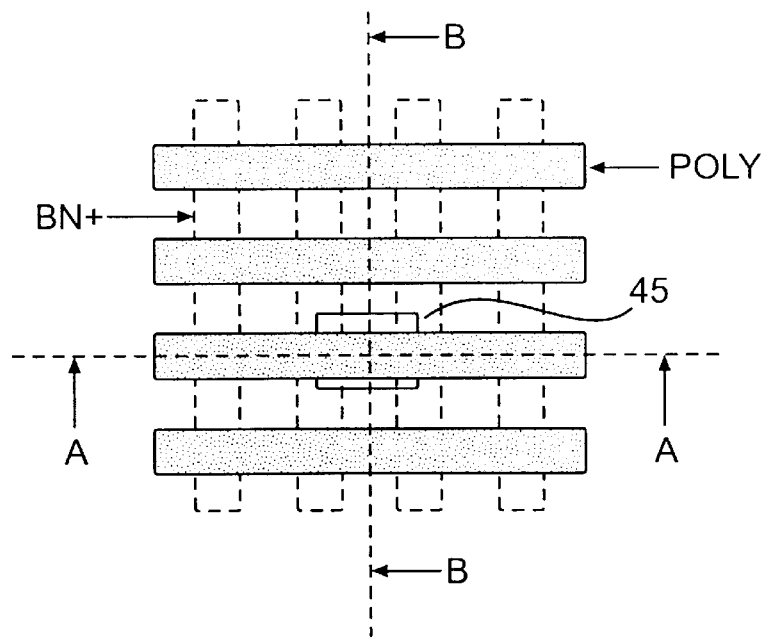
FIG. 4A is a top view that schematically depicts the memory cells of the mask ROM fabricated in accordance with a preferred embodiment of the present invention.
Figure 4B:
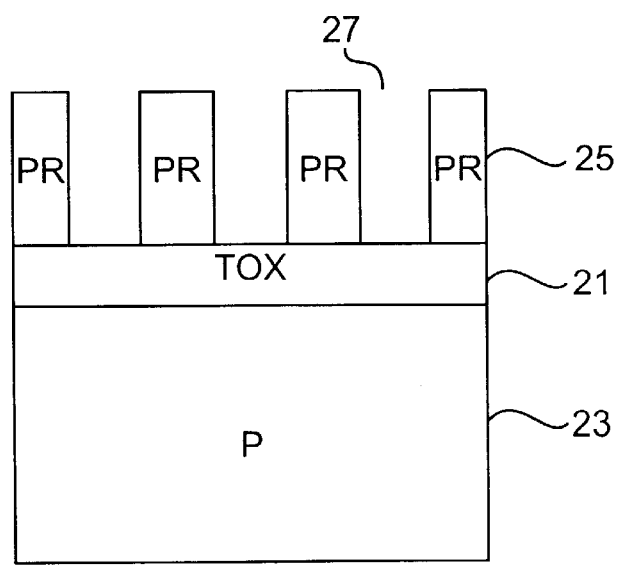
FIG. 4B is a cross-sectional view that schematically illustrates the step of forming a thick oxide layer on the cell area and printing a bit line pattern according to the present invention.

As shown in FIG. 4B, a thick oxide layer (TOX)(21) is deposited to a thickness of at least 1000Å over a P-type silicon semiconductor substrate (23). The thickness of the TOX layer is approximately ten time,he thickness of a 100 Å gate oxide. If the difference between the thicknesses of the TOX and the gate oxide is not great enough, it becomes difficult to distinguish between data bits programmed as 1 and 0. The thick oxide layer may be thermally grown or deposited by conventional techniques such as low pressure vapor deposition. Formation of a continuous thick oxide layer in this manner avoids lateral growth of the oxide and, the subsequent formation of a "bird's beak." For example, a field oxide layer avoids formation of a "bird's beak" in the memory area, since the oxide is grown over the entire memory area. Therefore, a "bird's beak" will only form at the border of the memory. Similarly, formation of a continuous thick oxide layer by, for example, low pressure CVD avoids formation of a "bird's beak" altogether.

A photoresist layer (PR) (25) is then coated on the surface of the thick oxide layer (21) and patterned by a conventional photolithography process to form multiple parallel strip-shaped openings (27) that define the bit lines (29) that will serve as the source/drain regions for the memory cell transistors.

Figure 5:
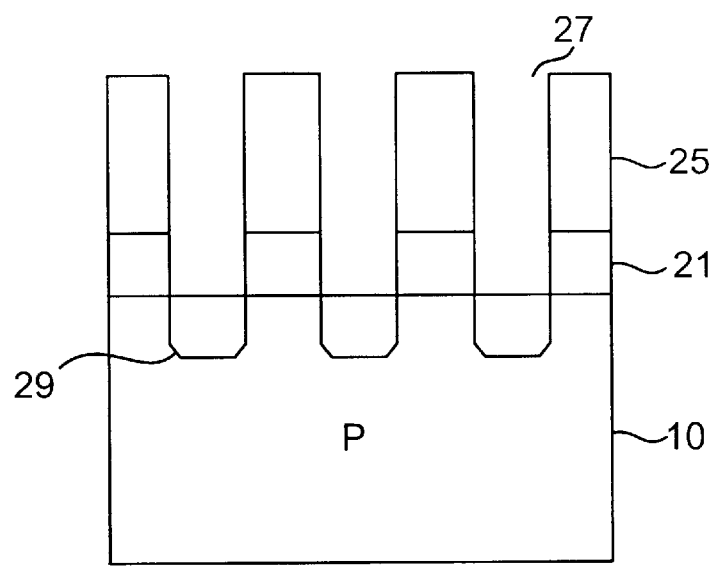
FIG. 5 is a cross-sectional view along line A—A of FIG. 4A schematically illustrating the step of etching away oxide above the bit line area and implanting N+ impurities to form buried bit lines.

Next, referring to FIGS. 4A, 4B, and 5, the oxide layer within the bit line areas is etched away to reveal the underlying substrate. Convention anisotropic etching techniques such as reactive ion etching are preferred. The photoresist layer is then used as a mask for ion implantation of N+impurities, such as arsenic or phosphorus. Arsenic impurities may be implanted at an energy of 60 to 120 keV in doses of $5 \times 10^{14}$ to $5 \times 10^{15}$. Phosphorus impurities may be implanted at an energy of 30 to 70 keV in doses of $5 \times 10^{14}$ to $5 \times 10^{15}$. As shown in FIG. 5, the N+ regions (29) formed by implantation in the exposed areas of the substrate form the buried bit lines of the ROM device.

Figure 6:
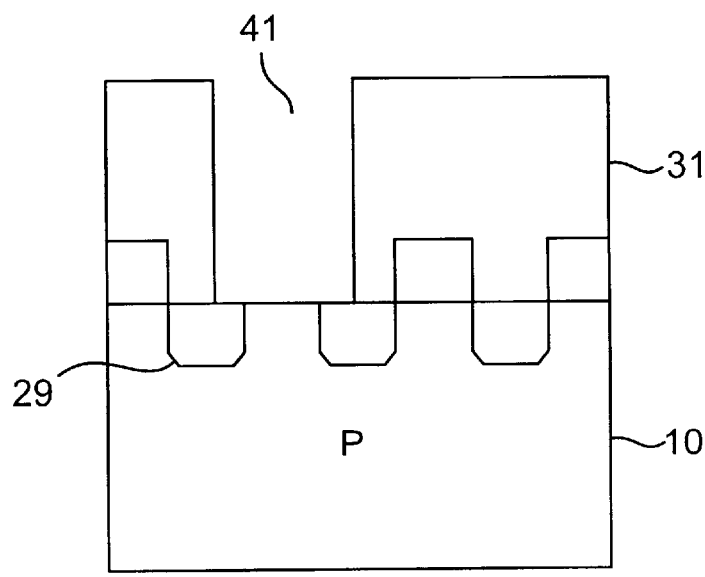
FIG. 6 is a cross-sectional view along line A—A of FIG. 4A schematically illustrating the step of printing a code pattern and etching away the oxide within the code area.
Figure 7:
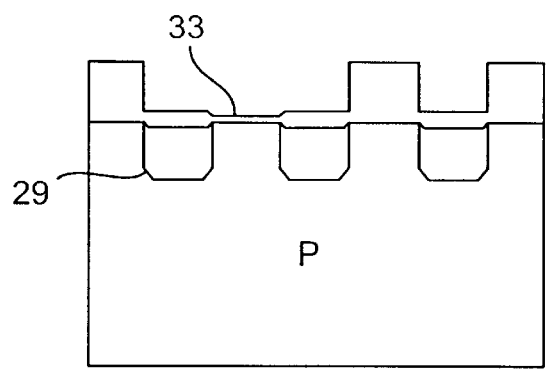
FIG. 7 is a cross-sectional view along line A—A of FIG. 4A schematically illustrating the step growing a gate oxide.

After removal of the first photoresist layer a second photoresist layer (31) is applied and patterned to expose areas of the substrate that will constitute the channel regions of the normally ON cells. Photolithography is utilized to define coding openings (41)in this photoresist layer. This is illustrated in FIG. 6. Coding openings selectively expose the substrate surface, allowing subsequent formation of a thin gate oxide (33) on the exposed surface. Conventional techniques are used to grow the gate oxide and its thickness depends on the process being used. Formation of the gate oxide is shown in FIG. 7. As shown in FIG. 7, the thickness of the gate oxide layer is thicker over the BN+ regions. This is due to the faster oxidation rate of the doped silicon which results in higher dopant density and, thus, a thicker oxide.

The photoresist layers are removed by, for example, applying solvents known in the art.

Figure 8A:
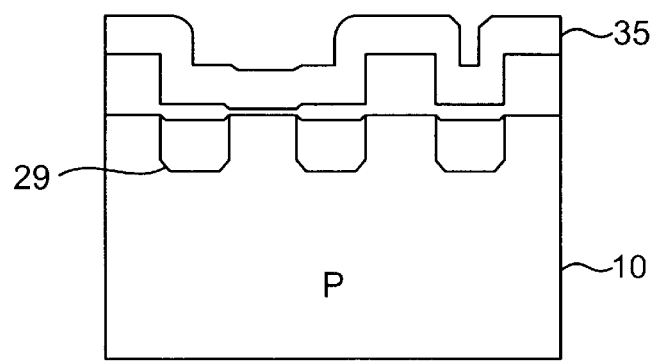
FIG. 8A is a cross-sectional view along line A—A of FIG. 4A that schematically illustrates the step of depositing and patterning the polysilicon gate electrodes.
Figure 8B:
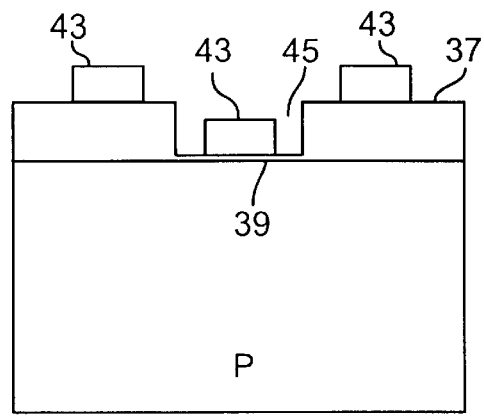
FIG. 8B is a cross-sectional view along line B—B of FIG. 4A that schematically illustrates the step of depositing and patterning the polysilicon gate electrodes.

The word line structure is then formed, as shown in FIGS. 8A and 8B, by depositing a blanket polysilicon (35) layer over the remaining portions of the thick oxide and the gate oxide layer. Deposition of the polysilicon may be by low vapor chemical vapor deposition or any other technique know in the art to a thickness of about 2000 to 4000Å. Photolithography is then used to form a plurality of gate electrodes (43) that constitute word lines for the memory array of the mask-type ROM device.

In the resulting structure, OFF state cells have high threshold voltage due to the patterned thick oxide (37) in the channel region. These cells will remain in the OFF state regardless of whether the word line voltage is high or low. The cells with code open have a gate oxide (39) of normal thickness. Cells with a normal thickness gate oxide can then be set to an ON state when the word line voltage is high.

What is claimed is:

1. A method for manufacturing a mask programmable ROM comprising the steps of:

forming a continuous oxide layer with a thickness greater than about 1000 Å on a semiconductor substrate;

forming a first mask layer over said oxide layer and patterning said first mask layer to form bit line areas;

removing regions of said oxide layer within said bit line areas to expose said semiconductor substrate;

ion implanting conductivity imparting dopants into said exposed substrate to form buried bit lines;

removing said first mask layer and forming a second mask layer;

printing a code pattern and forming coding openings that expose portions of said substrate between said bit lines;

removing said second mask layer;

growing a gate oxide within said coding openings;

depositing a conducting layer on remaining regions of said oxide layer, said buried bit line regions, and said gate oxide; and forming a plurality of conducting gate structures constituting word lines for said mask ROM.

2. The method of claim 1, wherein said semiconductor substrate is a P-type substrate.

3. The method of claim 1, wherein said oxide layer is deposited.

4. The method of claim 1, wherein said mask layer is a photoresist layer and removing regions of said mask layer to form said bit lines is by photolithography.

5. The method of claim 1, wherein removal of said oxide layer within the bit line area to expose said semiconductor substrate is accomplished by reactive ion etching.

6. The method of claim 1, wherein said conductivity imparting dopants are an N-type impurity material implanted at an energy of 30 keV to 120 keV.

7. The method of claim 1, wherein photolithography is used in forming a plurality of conducting gate structures.

8. The method of claim 1, wherein said conducting layer comprises a polysilicon layer.

9. A method for manufacturing a mask programmable ROM integrated into a CMOS fabrication process comprising the steps of:

growing a continuous oxide layer with a thickness greater than about 1000 Å on a P-type semiconductor substrate;

depositing a first mask layer on said oxide layer;

removing regions of said first mask layer to form bit line areas;

removing regions of said oxide layer within the bit line areas to expose said semiconductor substrate;

ion implanting conductivity imparting dopants into said exposed substrate to form buried bit lines;

removing said first mask layer;

forming a second mask layer and patterning said second mask layer to form coding openings exposing areas of said semiconductor substrate;

removing said second mask layer;

forming a gate oxide within said coding openings;

depositing a polysilicon layer; and forming a plurality of polysilicon gate electrodes oriented orthogonally to said bit lines constituting word lines for said mask ROM.

10. The method of claim 9, wherein said oxide layer is a field oxide layer.

11. The method of claim 9, wherein said oxide layer is thermally grown.

12. The method of claim 9, wherein said first and second mask layers are photoresist layers.

13. The method of claim 9, wherein the step of forming a plurality of polysilicon gate electrodes further comprises:

depositing a polysilicon layer over the remaining portions of said thick oxide layer and said gate oxide layer; and patterning said polysilicon layer to form a plurality of polysilicon gate electrodes oriented orthogonally to said bit lines constituting word lines for said mask ROM.

14. The method of claim 9, wherein said conductivity imparting dopants are an N-type impurity material implanted at an energy of 30 keV to 120 keV.

* * * * *